(12) United States Patent
Liu et al.

(10) Patent No.: US 12,028,980 B2
(45) Date of Patent: Jul. 2, 2024

(54) SWITCHED CAPACITOR CONVERTER PACKAGE STRUCTURE AND METHOD

(71) Applicant: Halo Microelectronics International, Campbell, CA (US)

(72) Inventors: Rui Liu, Fremont, CA (US); Songnan Yang, Frisco, TX (US)

(73) Assignee: Halo Microelectronics International, Campbell, CA (US)

( * ) Notice: Subject to any disclaimer, the term of this patent is extended or adjusted under 35 U.S.C. 154(b) by 402 days.

(21) Appl. No.: 17/511,039

(22) Filed: Oct. 26, 2021

(65) Prior Publication Data

US 2023/0126760 A1 Apr. 27, 2023

(51) Int. Cl.
| | |
|---|---|
| H05K 1/18 | (2006.01) |
| H01L 25/16 | (2023.01) |
| H02M 1/08 | (2006.01) |
| H02M 3/07 | (2006.01) |
| H05K 1/11 | (2006.01) |
| H05K 3/34 | (2006.01) |

(52) U.S. Cl.
CPC ............ H05K 1/181 (2013.01); H01L 25/16 (2013.01); H02M 1/08 (2013.01); H02M 3/07 (2013.01); H05K 1/113 (2013.01); H05K 3/3415 (2013.01); H05K 3/3436 (2013.01); H05K 3/3442 (2013.01); H05K 2201/10015 (2013.01); H05K 2201/10166 (2013.01); H05K 2201/10522 (2013.01); H05K 2201/10545 (2013.01)

(58) Field of Classification Search
CPC ...... H05K 1/181; H05K 1/113; H05K 3/3415; H05K 3/3436; H05K 3/3442; H05K 2201/10015; H05K 2201/10166; H05K 2201/10522; H05K 2201/10545; H01L 25/16; H02M 1/08; H02M 3/07
See application file for complete search history.

(56) References Cited

U.S. PATENT DOCUMENTS

| 7,248,483 | B2 * | 7/2007 | West | H02M 7/003 |
| | | | | 361/801 |
| 9,111,928 | B2 * | 8/2015 | Li | H01L 23/49562 |
| 10,360,485 | B2 * | 7/2019 | Liu | G06K 19/06206 |
| 10,375,824 | B2 * | 8/2019 | Sperber | H05K 1/115 |
| 11,532,987 | B2 * | 12/2022 | Han | H02M 1/0058 |
| 2010/0124035 | A1 * | 5/2010 | Bandholz | H05K 1/162 |
| | | | | 361/782 |
| 2015/0009734 | A1 * | 1/2015 | Stahl | H02M 7/53871 |
| | | | | 363/98 |

* cited by examiner

Primary Examiner — Kyle J Moody
(74) Attorney, Agent, or Firm — AP3 Law Firm PLLC

(57) ABSTRACT

A switched capacitor converter package includes a semiconductor package on a first side of an electrical routing apparatus, a first capacitor and a second capacitor on a second side of the electrical routing apparatus, wherein the first capacitor and the second capacitor are adjacent to each other and connected in parallel, and a third capacitor and a fourth capacitor connected on the second side of the electrical routing apparatus, wherein the third capacitor and the fourth capacitor are adjacent to each other and connected in parallel.

20 Claims, 14 Drawing Sheets

SWITCHED CAPACITOR CONVERTER PACKAGE STRUCTURE AND METHOD

TECHNICAL FIELD

The present invention relates to a switched capacitor converter package, and, in particular embodiments, to a dual-phase switched capacitor converter package.

BACKGROUND

As technologies further advance, a variety of portable devices, such as mobile phones, tablet PCs, digital cameras, MP3 players and/or the like, have become popular. With the popularization of fast charging of portable devices, switched capacitor converters are gradually being used more and more widely due to their high power conversion efficiency.

FIG. 1 illustrates a schematic diagram of a dual-phase switched capacitor converter. A first phase of the dual-phase switched capacitor converter comprises switches Q1, Q2, Q3 and Q4 connected in series between an input voltage bus Vin and ground. A first flying capacitor CF1 is connected between a common node (P1) of switches Q1 and Q2, and a common node (P2) of switches Q3 and Q4.

A second phase of the dual-phase switched capacitor converter comprises switches Q5, Q6, Q7 and Q8 connected in series between Vin and ground. A second flying capacitor CF2 is connected between a common node (P3) of switches Q5 and Q6, and a common node (P4) of Q7 and Q8. A common node of switches Q2 and Q3 and a common node of switches Q6 and Q7 are connected together and further connected to an output voltage bus Vo.

An input capacitor CIN is connected between VIN and ground. The input capacitor CIN is employed to reduce the input voltage ripple so as to supply a steady input voltage for the dual-phase switched capacitor converter. An output capacitor Co is connected between Vo and ground. The output capacitor Co is employed to reduce the output voltage ripple so as to supply a steady output voltage for the load coupled to the dual-phase switched capacitor converter.

In operation, the first phase and the second phase of the dual-phase switched capacitor converter is configured to operate in an alternating manner. The dual-phase switched capacitor converter functions as a 2:1 charge pump. In other words, the output voltage at Vo is equal to one half of the input voltage at VIN.

The power conversion efficiency of the dual-phase switched capacitor converter is mainly determined by the conduction losses of the switches Q1-Q8, the driving losses of the switches Q1-Q8 and the losses from the charge transfer between CIN, CF1, CF2 and Co. In operation, the charge transfer losses between the capacitors have gradually become a main factor to determine the power conversion efficiency of the dual-phase switched capacitor converter. The charge transfer losses are mainly caused by the transient current during the charging and discharging of a flying capacitor. In particular, when the charge transfer losses occur, a large current pulse flows through the flying capacitor. Such a large current pulse can cause a significant power loss.

The amplitude of the current pulse flowing through the flying capacitor is determined by the voltage difference between the voltage on the flying capacitor and the voltage on the input or output capacitor when the switching state changes. For example, when a large voltage difference between the voltage on a flying capacitor (e.g., CF2) and the output voltage Vo occurs, a large current pulse flows from the flying capacitor to Co. In operation, the voltage difference across a flying capacitor is mainly determined by the switching frequency and the capacitance value of the flying capacitor. When the switching frequency is constant, the voltage difference across the flying capacitor can be reduced through increasing the capacitance value of the flying capacitor. A smaller voltage change on the flying capacitor can reduce the amplitude of the current pulse, thereby improving the power conversion efficiency. In practical applications, due to the limitation of the capacitance of a single capacitor, it is necessary to use multiple flying capacitors in parallel to achieve higher total capacitance in order to achieve higher power conversion efficiency.

FIG. 2 illustrates a layout of a dual-phase switched capacitor converter having multiple flying capacitors. The switches and control circuits of the dual-phase switched capacitor converter are packaged in a suitable semiconductor package (e.g., a chip scale package). The semiconductor package is mounted on a printed circuit board (PCB) through a plurality of bumps (e.g., P1, P2, P3 and P4) arranged in rows and columns as shown in FIG. 2.

Referring back to FIG. 1, P1 represents a bump connected to the P1 node of the dual-phase switched capacitor converter. P2 represents a bump connected to the P2 node of the dual-phase switched capacitor converter. P3 represents a bump connected to the P3 node of the dual-phase switched capacitor converter. P4 represents a bump connected to the P4 node of the dual-phase switched capacitor converter. CF11 and CF12 are flying capacitors of the first phase of the dual-phase switched capacitor converter. CF11 and CF12 are connected in parallel between P1 and P2. CF21 and CF22 are flying capacitors of the second phase of the dual-phase switched capacitor converter. CF21 and CF22 are connected in parallel between P3 and P4.

As shown in FIG. 2, the flying capacitors CF11 and CF12 are placed on a first side of the semiconductor package. The flying capacitors CF21 and CF22 are placed on a second side of the semiconductor package. The first side and the second side are two opposite sides of the semiconductor package as shown in FIG. 2.

A first terminal of CF11 and a first terminal CF12 are connected to P1 through a first PCB trace 111. A second terminal of CF11 and a second terminal CF12 are connected to P2 through a second PCB trace 112. A first terminal of CF21 and a first terminal CF22 are connected to P3 through a third PCB trace 113. A second terminal of CF21 and a second terminal CF22 are connected to P4 through a fourth PCB trace 114. It can be seen that due to the large number of peripheral passive components (e.g., flying capacitors CF11, CF12, CF21 and CF22), the entire dual-phase switched capacitor converter occupies a much larger PCB area than the chip scale package itself.

As shown in FIG. 2, the dashed lines on the left side indicate the current loop of the first phase. The dashed lines on the right side indicate the current loop of the second phase. Since P1, P2, P3 and P4 are routed from both sides of the semiconductor package, the distance between CF12 and P1 is greater than the distance between CF11 and P1. Moreover, the planar capacitor placement shown in FIG. 2 also makes the PCB traces from the flying capacitors to the bumps longer. The long traces bring extra equivalent series resistance (ESR) and equivalent series inductance (ESL). The extra ESR and ESL may affect the efficiency of the dual-phase switched capacitor converter.

The layout arrangement of the flying capacitors shown in FIG. 2 causes various issues such as a large layout area, a significant increase in ESR and/or ESL, stronger electromagnetic interference (EMI) and ineffective chip heat dissipation.

First, the layout shown in FIG. 2 may cause a significant increase in ESR. As shown in FIG. 2, the two flying capacitors of one phase are connected in parallel. One is adjacent to the semiconductor package. The other is away from the semiconductor package. The distance difference results in an uneven current distribution. The uneven current distribution makes the charging and discharging circuits of the flying capacitors have higher equivalent series resistance. The increased equivalent series resistance results in reduced power conversion efficiency.

Second, the layout shown in FIG. 2 may cause strong electromagnetic interference. In operation, when the flying capacitors CF21 and CF22 are charged, the flying capacitors CF11 and CF12 discharge to the load. When the flying capacitors are placed as shown in FIG. 2, the charging current of CF21 and CF22 flows from P3 to P4 in a clockwise direction as indicated by the dashed lines on the right side, while the discharging current of CF11 and CF12 flows from P2 to P1 in a clockwise direction as indicated by the dashed lines on the left side. At any time, the currents of these two phases flow in the same direction. The far-field radiation generated by the currents of these two phases is superimposed in phase, resulting in strong EMI spurious emissions.

Third, the layout shown in FIG. 2 may cause inefficient heat dissipation of the semiconductor package. In many applications, the thickness of the flying capacitors is often higher than that of the chip scale package. In this way, when the flying capacitors are placed according to FIG. 2, it is difficult to add a heat dissipation solution (e.g., a heat sink) above the chip scale package to dissipate the heat generated by the dual-phase switched capacitor converter. At the same time, due to the structure of the chip scale package, the heat dissipation capacity of the bumps under the chip scale package is also limited, which may cause the semiconductor chip to perform power throttle due to the temperature rise of the chip.

As power consumption has become more important, there may be a need for further improving the performance of the dual-phase switched capacitor converter shown in FIG. 1. It is desirable to have a new flying capacitor placement so as to achieve more uniform current distribution among multiple capacitors, higher efficiency, less EMI emission and effective heat dissipation.

SUMMARY

These and other problems are generally solved or circumvented, and technical advantages are generally achieved, by preferred embodiments of the present disclosure which provide a dual-phase switched capacitor converter package.

In accordance with an embodiment, a switched capacitor converter package comprises a semiconductor package on a first side of an electrical routing apparatus, a first capacitor and a second capacitor on a second side of the electrical routing apparatus, wherein the first capacitor and the second capacitor are adjacent to each other and connected in parallel, and a third capacitor and a fourth capacitor connected on the second side of the electrical routing apparatus, wherein the third capacitor and the fourth capacitor are adjacent to each other and connected in parallel.

In accordance with another embodiment, a method comprises mounting a semiconductor package on a backside of an electrical routing apparatus, mounting a plurality of capacitors on a front side of the electrical routing apparatus, wherein the plurality of capacitors is electrically coupled to the semiconductor package through a plurality of vias in the electrical routing apparatus, and arranging two adjacent capacitors and a corresponding conductive channel electrically coupled to the two adjacent capacitors such that a center of the corresponding conductive channel is a midpoint between two terminals of the two adjacent capacitors.

In accordance with yet another embodiment, a system comprises a semiconductor package on a first side of a printed circuit board, wherein the semiconductor package comprises switches of a dual-phase switched capacitor converter, a first capacitor on a second side of the printed circuit board, wherein the first capacitor is electrically connected to two switching nodes of a first phase of the dual-phase switched capacitor converter through a first via and a second via, respectively, and a second capacitor on the second side of the printed circuit board, wherein the second capacitor is electrically connected to two switching nodes of a second phase of the dual-phase switched capacitor converter through a third via and a fourth via, respectively.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely to a dual-phase switched capacitor converter package. The invention may also be applied, however, to a variety of power systems. Hereinafter, various embodiments will be explained in detail with reference to the accompanying drawings.

Figure 3:
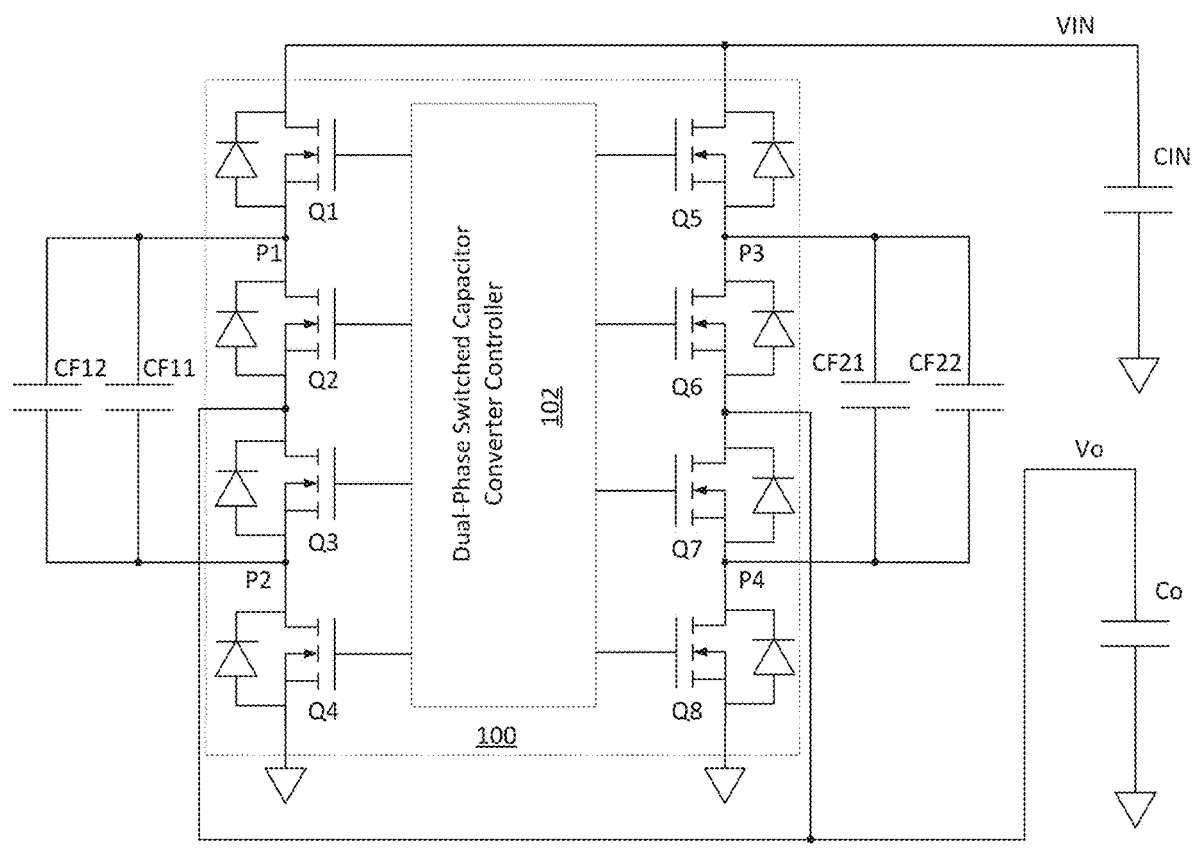
FIG. 3 illustrates a schematic diagram of a dual-phase switched capacitor converter in accordance with various embodiments of the present disclosure

FIG. 3 illustrates a schematic diagram of a dual-phase switched capacitor converter in accordance with various embodiments of the present disclosure. The dual-phase switched capacitor converter has an input coupled to an input voltage bus VIN and an output coupled to an output voltage bus Vo. An input capacitor CIN is connected between VIN and ground. An output capacitor Co is connected between Vo and ground.

The dual-phase switched capacitor power converter comprises two phases. A first phase comprises a first switch Q1, a second switch Q2, a third switch Q3 and a fourth switch Q4 connected in series between the input voltage bus VIN and ground. A first flying capacitor CF11 and a second flying capacitor CF12 are connected between a common node (P1) of switches Q1 and Q2, and a common node (P2) of switches Q3 and Q4.

A second phase comprises a fifth switch Q5, a sixth switch Q6, a seventh switch Q7 and an eighth switch Q8 connected in series between the input voltage bus VIN and ground. A third flying capacitor CF21 and a fourth flying capacitor CF22 are connected between a common node (P3) of switches Q5 and Q6, and a common node (P4) of switches Q7 and Q8.

As shown in FIG. 3, a common node of switches Q2 and Q3 is connected to the output voltage bus Vo. A common node of switches Q6 and Q7 is also connected to the output voltage bus Vo. A dual-phase switched capacitor converter controller 102 is configured to generate gate drive signals for switches Q1-Q8.

In operation, the operating principle of the first phase is similar to that of the second phase except that the drive signals of the first phase (e.g., Q1) and the drive signals of the second phase (e.g., Q5) are 180 degrees out of phase from each other. For simplicity, only the operating principle of the first phase is described below in detail.

In operation, the first phase of the dual-phase switched capacitor converter is configured to operate in two different operating phases. During the first operating phase, switches Q1 and Q3 are turned on, and switches Q2 and Q4 are turned off. Since switches Q1 and Q3 are turned on, a first conductive path is established between VIN and Vo. The first conductive path is formed by switch Q1, the flying capacitors CF11, CF12 and switch Q3. The current flows from VIN to Vo through the first conductive path. During the first operating phase, the flying capacitors CF11 and CF12 are charged and energy is stored in the flying capacitors CF11 and CF12 accordingly.

During the second operating phase, switches Q1 and Q3 are turned off, and switches Q2 and Q4 are turned on. Since switches Q2 and Q4 are turned on, a second conductive path is established. The second conductive path is formed by switch Q4, the flying capacitors CF11, CF12 and switch Q2. During the second operating phase, the current discharges the flying capacitors CF11 and CF12 and the energy stored in the flying capacitors CF11 and CF12 is delivered to the output accordingly.

The dual-phase switched capacitor power converter may be configured to operate either in a 2:1 charge pump mode or in a 1:2 reverse charge pump mode. The operating principle above is based on the 2:1 charge pump mode. The operating principle of the 1:2 reverse charge pump mode is similar to that of the 2:1 charge pump mode, and hence are not discussed herein again to avoid repetition.

In accordance with an embodiment, the switches of FIG. 3 (e.g., switches Q1-Q8) may be metal oxide semiconductor field-effect transistor (MOSFET) devices, bipolar junction transistor (BJT) devices, super junction transistor (SJT) devices, insulated gate bipolar transistor (IGBT) devices, gallium nitride (GaN) based power devices and/or the like.

It should be noted while FIG. 3 shows the switches Q1-Q8 are implemented as single n-type transistors, a person skilled in the art would recognize there may be many variations, modifications and alternatives. For example, depending on different applications and design needs, at least some of the switches Q1-Q8 may be implemented as p-type transistors. Furthermore, each switch shown in FIG. 3 may be implemented as a plurality of switches connected in parallel. Moreover, a capacitor may be connected in parallel with one switch to achieve zero voltage switching (ZVS)/zero current switching (ZCS).

In some embodiments, switches Q1-Q8 and the dual-phase switched capacitor converter controller 102 are packaged in a semiconductor package (e.g., a chip scale package). The flying capacitors CF11, CF12, CF21 and CF22 are placed on a PCB and connected to the semiconductor package through a plurality of PCB traces and the bumps of the semiconductor package. Switches Q1-Q8, the dual-phase switched capacitor converter controller 102, flying capacitors CF11, CF12, CF21 and CF22 and the PCB form a switched capacitor converter package.

Figure 4:
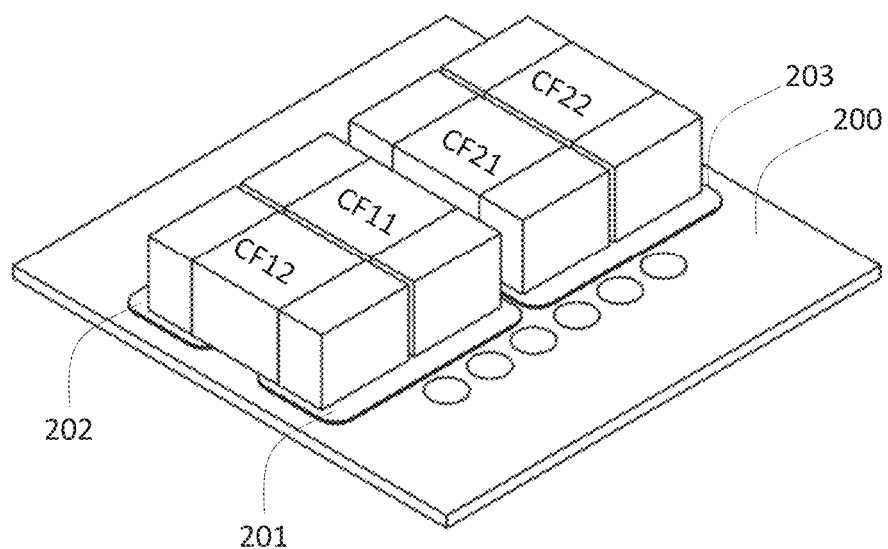
FIG. 4 illustrates a perspective view of a top side of a switched capacitor converter package in accordance with various embodiments of the present disclosure.

FIG. 4 illustrates a perspective view of a top side of a switched capacitor converter package in accordance with various embodiments of the present disclosure. A first capacitor CF11, a second capacitor CF12 a third capacitor CF21 and a fourth capacitor CF22 are mounted on an electrical routing apparatus 200. In some embodiments, the electrical routing apparatus 200 is a printed circuit board (PCB) having a plurality of vias. In alternative embodiments, the electrical routing apparatus 200 may be implemented as other suitable semiconductor interconnection devices such as a redistribution layer (RDL) in a chip package, a low-temperature co-fired ceramic device and the like.

Referring back to FIG. 3, the first capacitor CF11 and the second capacitor CF12 are the flying capacitors of the first phase of the dual-phase switched capacitor converter. The third capacitor CF21 and the fourth capacitor CF22 are the flying capacitors of the second phase of the dual-phase switched capacitor converter.

As shown in FIG. 4, the first capacitor CF11 and the second capacitor CF12 are adjacent to each other and connected in parallel. A first terminal of the first capacitor CF11 and a first terminal of the second capacitor CF12 are connected together through a first PCB trace 201 and electrically coupled to the semiconductor package (not shown but illustrated in FIG. 5) through a first via (e.g., V1 in FIG. 6). A second terminal of the first capacitor CF11 and a second terminal of the second capacitor CF12 are connected together through a second PCB trace 202 and electrically coupled to the semiconductor package through a second via (e.g., V2 in FIG. 6).

The third capacitor CF21 and the fourth capacitor CF22 are adjacent to each other and connected in parallel. A first terminal of the third capacitor CF21 and a first terminal of the fourth capacitor CF22 are connected together through a third PCB trace 203 and electrically coupled to the semiconductor package through a third via (e.g., V3 in FIG. 6). A second terminal of the third capacitor CF21 and a second terminal of the fourth capacitor CF22 are connected together through a fourth PCB trace (e.g., fourth PCB trace 204 not shown but illustrated in FIG. 6) and electrically coupled to the semiconductor package through a fourth via (e.g., V4 in FIG. 6).

Figure 5:
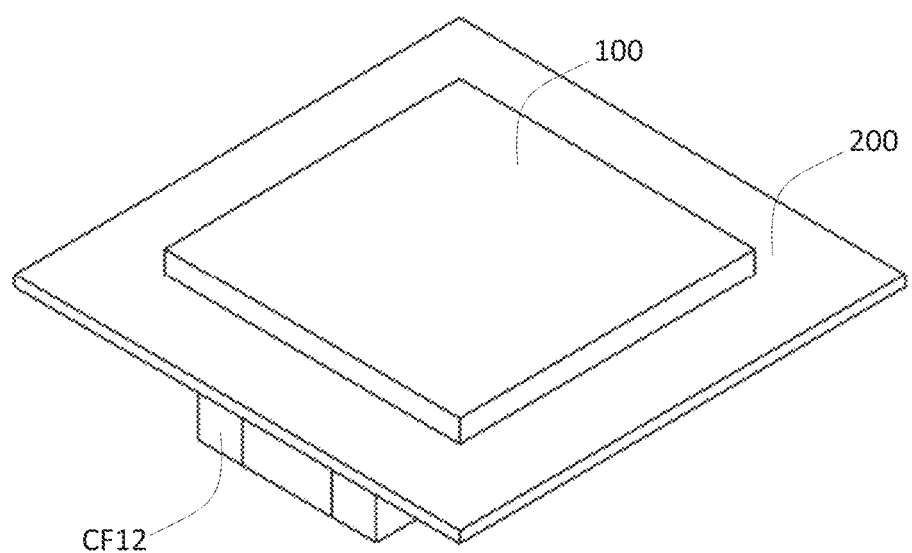
FIG. 5 illustrates a perspective view of a bottom side of the switched capacitor converter package in accordance with various embodiments of the present disclosure.

FIG. 5 illustrates a perspective view of a bottom side of the switched capacitor converter package in accordance with various embodiments of the present disclosure. A semiconductor package 100 is mounted on the electrical routing apparatus 200 through a plurality of bumps (not shown but illustrated in FIG. 6). The semiconductor package 100 comprises the switches Q1-Q8 of the dual-phase switched capacitor converter. The switches Q1-Q8 of the dual-phase switched capacitor converter are electrically connected to the flying capacitors CF11, CF12, CF21 and CF22 through a plurality of vias in the electrical routing apparatus 200. The connection between the flying capacitors and the semiconductor package 100 will be shown below with respect to FIGS. 6-8.

Figure 6:
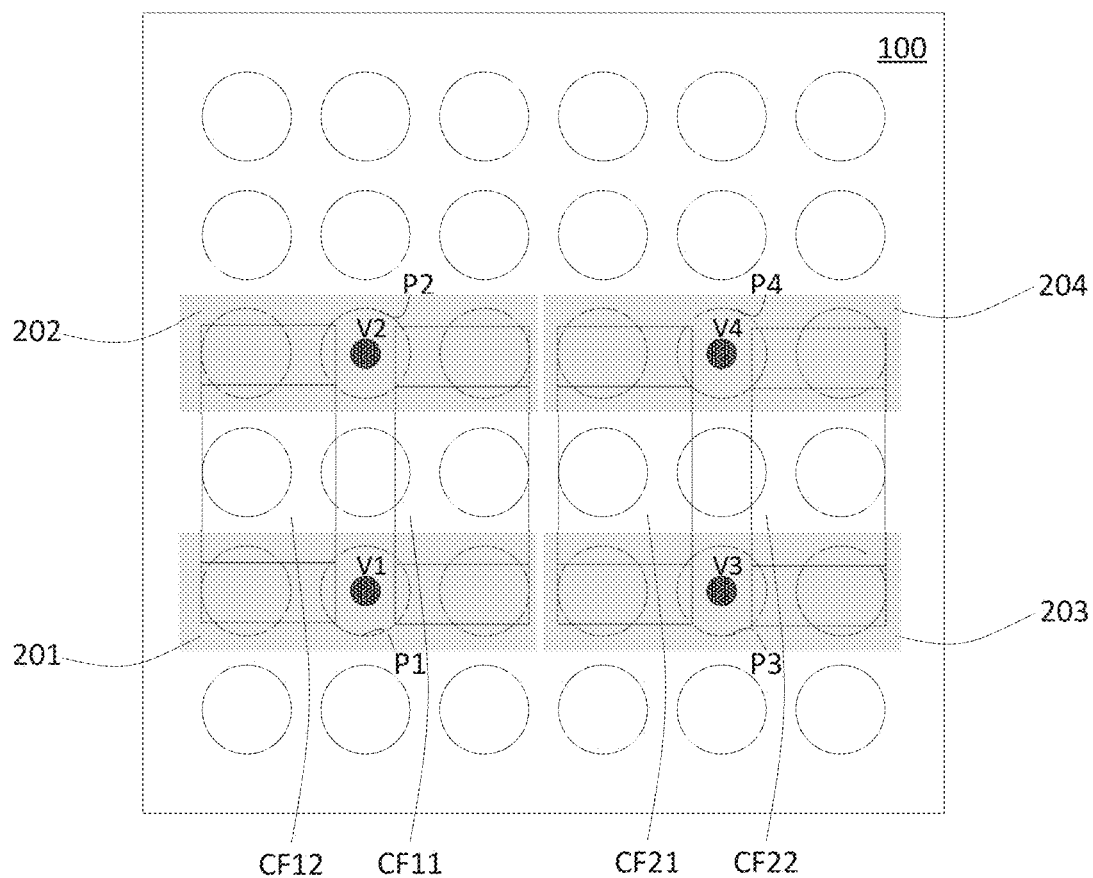
FIG. 6 illustrates a top view of the switched capacitor converter package in accordance with various embodiments of the present disclosure.

FIG. 6 illustrates a top view of the switched capacitor converter package in accordance with various embodiments of the present disclosure. For better illustrating the connection between the flying capacitors CF11, CF12, CF21, CF22 and the semiconductor package 100, the electrical routing apparatus 200 is intentionally hidden from view.

Figure 1:
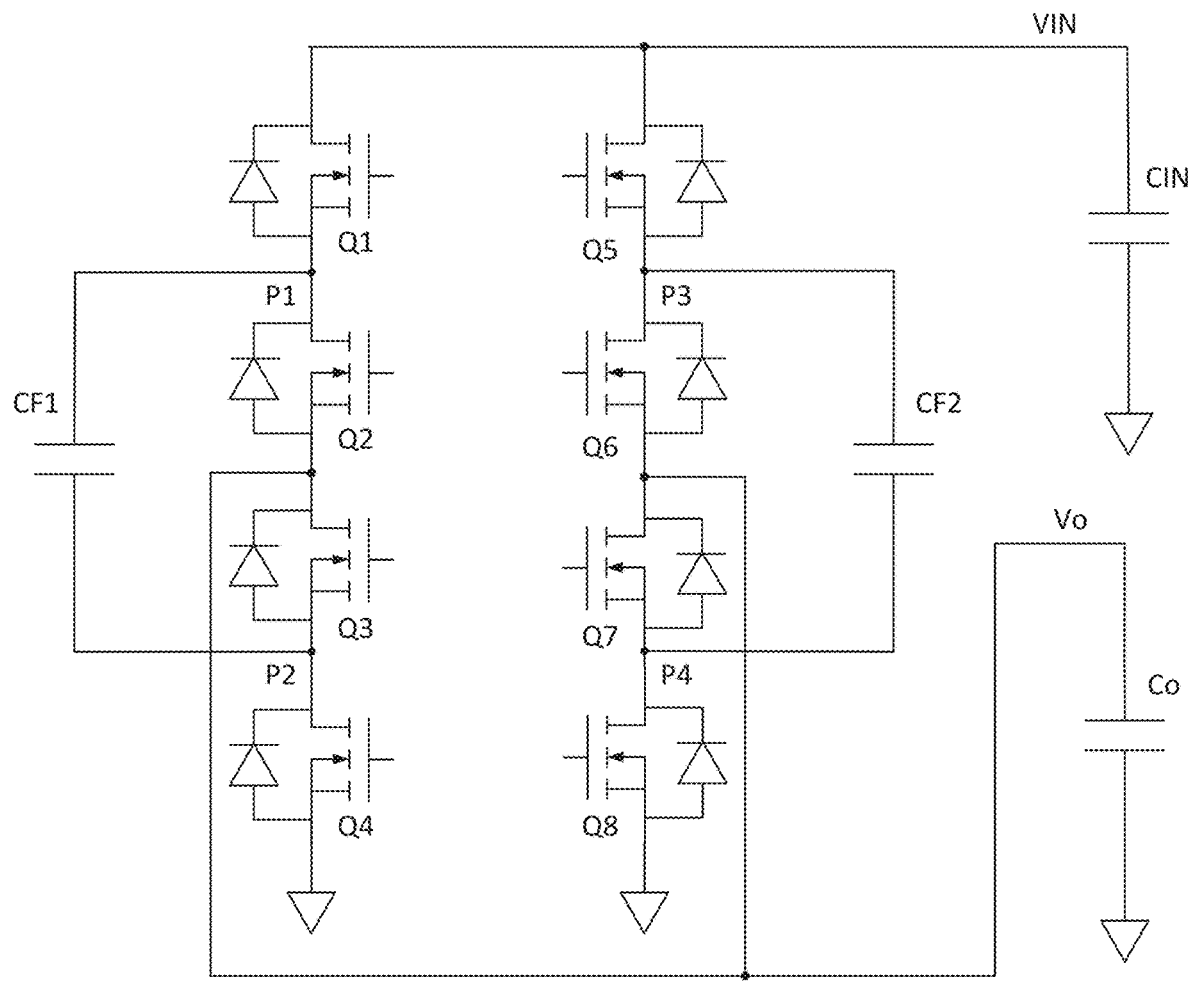
FIG. 1 illustrates a schematic diagram of a dual-phase switched capacitor converter.

As shown in FIG. 6, a first terminal of the first capacitor CF11 and a first terminal of the second capacitor CF12 are connected together through a first PCB trace 201 and electrically coupled to the semiconductor package 100 through a first via V1. The first via V1 is over a bump connected to the P1 node shown in FIG. 1. As shown in FIG. 6, the first terminal of the first capacitor CF11 and the first terminal of the second capacitor CF12 are arranged in a symmetrical manner with respect to the first via V1.

As shown in FIG. 6, a second terminal of the first capacitor CF11 and a second terminal of the second capacitor CF12 are connected together through a second PCB trace 202 and electrically coupled to the semiconductor package 100 through a second via V2. The second via V2 is over a bump connected to the P2 node shown in FIG. 1. As shown in FIG. 6, the second terminal of the first capacitor CF11 and the second terminal of the second capacitor CF12 are arranged in a symmetrical manner with respect to the second via V2.

As shown in FIG. 6, a first terminal of the third capacitor CF21 and a first terminal of the fourth capacitor CF22 are connected together through a third PCB trace 203 and electrically coupled to the semiconductor package 100 through a third via V3. The third via V3 is over a bump connected to the P3 node shown in FIG. 1. As shown in FIG. 6, the first terminal of the third capacitor CF21 and the first terminal of the fourth capacitor CF22 are arranged in a symmetrical manner with respect to the third via V3.

As shown in FIG. 6, a second terminal of the third capacitor CF21 and a second terminal of the fourth capacitor CF22 are connected together through a fourth PCB trace 204 and electrically coupled to the semiconductor package 100 through a fourth via V4. The fourth via V4 is over a bump connected to the P4 node shown in FIG. 1. As shown in FIG. 6, the second terminal of the third capacitor CF21 and the second terminal of the fourth capacitor CF22 are arranged in a symmetrical manner with respect to the fourth via V4.

The arrangement of flying capacitors CF11 and CF12 makes the terminal distances from the nodes P1 and P2 to the two flying capacitors CF11 and CF12 substantially the same. The equal distance between the flying capacitors and the respective nodes helps to distribute the current evenly between the two flying capacitors CF11 and CF12. Likewise, the arrangement of flying capacitors CF21 and CF22 makes the terminal distances from the nodes P3 and P4 to the two flying capacitors CF21 and CF22 substantially the same. The equal distance between the flying capacitors and the respective nodes P3 and P4 helps to distribute the current evenly between the two flying capacitors CF21 and CF22.

It should be noted that the equal distance between the flying capacitors and the respective nodes described above is merely an example. A person skilled in the art would understand there may many variations, modifications and alternatives. For example, one PCB trace may be electrically coupled to the semiconductor package 100 through a plurality of vias. Furthermore, the via or the plurality of vias may be not in direct contact with the corresponding bump. In case the flying capacitors cannot be arranged in a symmetrical manner, a via or a plurality of vias should be arranged such that the distance from P1 to the flying capacitor CF11 is substantially equal to the distance from P1 to the flying capacitor CF12, and, the distance from P2 to the flying capacitor CF11 is substantially equal to the distance from P2 to the flying capacitor CF12. Likewise, a via or a plurality of vias should be arranged such that the distance from P3 to the flying capacitor CF21 is substantially equal to the distance from P3 to the flying capacitor CF22, and, the distance from P4 to the flying capacitor CF21 is substantially equal to the distance from P4 to the flying capacitor CF22.

It should be noted that the balanced current distribution can achieve the minimum ESR, thereby reducing the power losses. The dual-phase switched capacitor converter may operate in a wide frequency range. In comparison with the layout shown in FIG. 2, at a very low frequency (e.g., the switching frequency is less than 100 KHz), the ESR of the switched capacitor converter package shown in FIG. 6 is smaller than the ESR of the conventional system shown in FIG. 2 because the short PCB traces shown in FIG. 6 helps to reduce the value of the ESR. At a high frequency (e.g., the switching frequency is between 100 KHz and 1 MHz), the ESR of the switched capacitor converter package shown in FIG. 6 is smaller than the ESR of the conventional system shown in FIG. 2 because the ESR remains stable as the almost equal current distribution between the two flying capacitors does not change with the increase in frequency. On the contrary, for the conventional system shown in FIG. 2, as the frequency increases, more and more current starts to flow through the flying capacitors closer to the semiconductor package, thereby causing the total equivalent series resistance to increase significantly.

Figure 7:
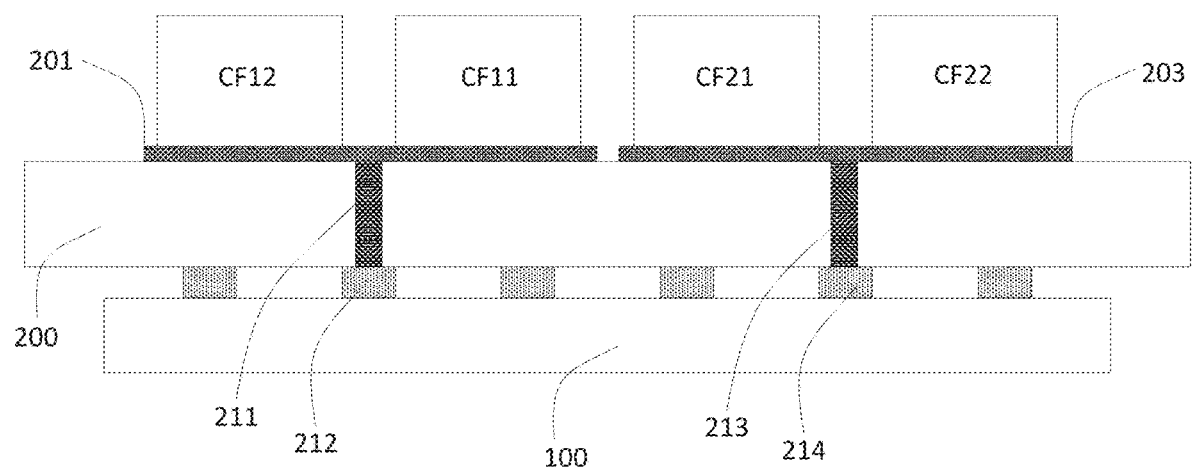
FIG. 7 illustrates a cross sectional view of a first implementation of the via connection of the switched capacitor converter package in accordance with various embodiments of the present disclosure.

FIG. 7 illustrates a cross sectional view of a first implementation of the via connection of the switched capacitor converter package in accordance with various embodiments of the present disclosure. As shown in FIG. 7, a first capacitor CF11, a second capacitor CF12, a third capacitor CF21 and a fourth capacitor CF22 are mounted on a first side of the electrical routing apparatus 200. A semiconductor package 100 is mounted on a second side of the electrical routing apparatus 200 through a plurality of bumps 212 and 214. In some embodiments, the electrical routing apparatus 200 is implemented as a PCB. The first capacitor CF11 and the second capacitor CF12 are two flying capacitors connected to a first phase of a dual-phase switched capacitor converter. The third capacitor CF21 and the fourth capacitor CF22 are two flying capacitors connected to a second phase of the dual-phase switched capacitor converter. The semiconductor package 100 comprises the switches of the dual-phase switched capacitor converter and a controller for generating gate drive signals for the switches.

As shown in FIG. 7, one terminal of the first capacitor CF11 and one terminal of the second capacitor CF12 are connected together through a first PCB trace 201 and electrically coupled to the semiconductor package 100 through a first via 211 and a bump 212. The first via 211 is in direct contact with the bump 212. The one terminal of the first capacitor CF11 and the one terminal of the second capacitor CF12 are arranged in a symmetrical manner with respect to the first via 211. As shown in FIG. 7, the distance between the one terminal of the first capacitor CF11 to the bump 212 is substantially equal to the distance between the one terminal of the second capacitor CF12 to the bump 212.

As shown in FIG. 7, one terminal of the third capacitor CF21 and one terminal of the fourth capacitor CF22 are connected together through a third PCB trace 203 and electrically coupled to the semiconductor package 100 through a second via 213 and a bump 214. The second via 213 is in direct contact with the bump 214. The one terminal of the third capacitor CF21 and the one terminal of the fourth capacitor CF22 are arranged in a symmetrical manner with respect to the second via 213. As shown in FIG. 7, the distance between the one terminal of the third capacitor CF21 to the bump 214 is substantially equal to the distance between the one terminal of the fourth capacitor CF22 to the bump 214.

Figure 8:
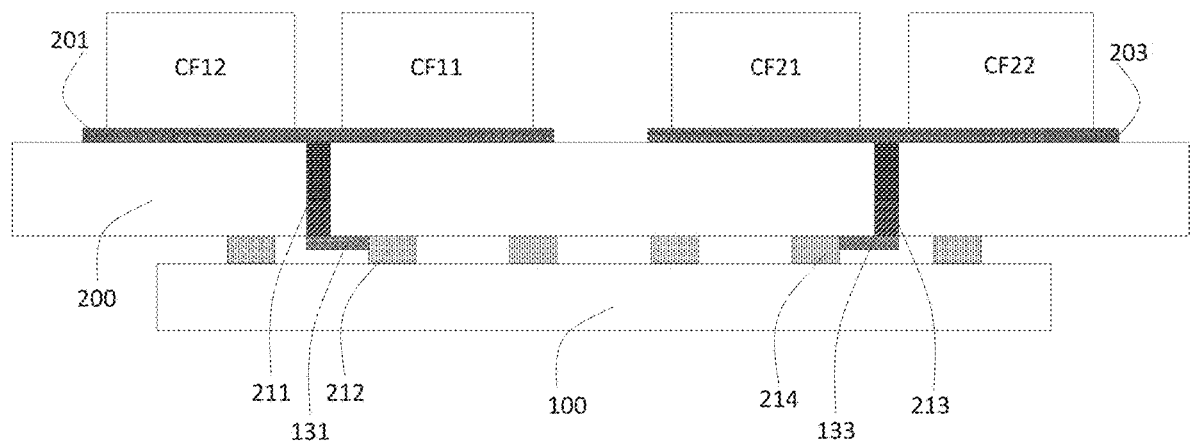
FIG. 8 illustrates a cross sectional view of a second implementation of the via connection of the switched capacitor converter package in accordance with various embodiments of the present disclosure.

FIG. 8 illustrates a cross sectional view of a second implementation of the via connection of the switched capacitor converter package in accordance with various embodiments of the present disclosure. The second implementation of the switched capacitor converter package shown in FIG. 8 is similar to that shown in FIG. 7 except that at least one via is connected to a corresponding bump of the semiconductor package 100 through a redistribution line formed on the second side of the electrical routing apparatus 200.

As shown in FIG. 8, the first via 211 is connected to the bump 212 through a first redistribution line 131. The second via 213 is connected to the bump 214 through a second redistribution line 133. By using the redistribution lines 131 and 133, the switched capacitor converter package can maintain the symmetrical arrangement of the flying capacitors. In particular, as shown in FIG. 8, one terminal of CF11 and one terminal of CF12 are arranged in a symmetrical manner with respect to the first via 211. One terminal of CF21 and one terminal of CF22 are arranged in a symmetrical manner with respect to the second via 213.

Figure 9:
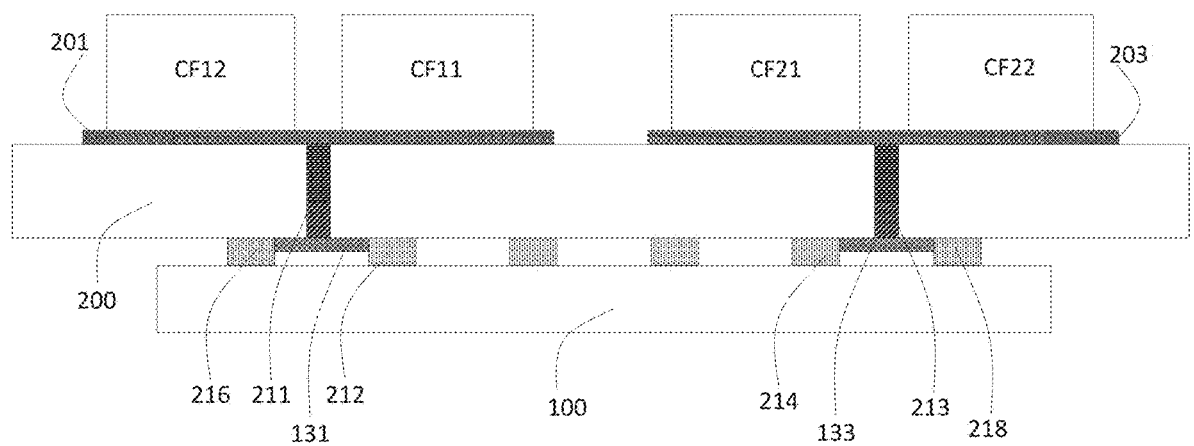
FIG. 9 illustrates a cross sectional view of a third implementation of the via connection of the switched capacitor converter package in accordance with various embodiments of the present disclosure.

FIG. 9 illustrates a cross sectional view of a third implementation of the via connection of the switched capacitor converter package in accordance with various embodiments of the present disclosure. The third implementation of the switched capacitor converter package shown in FIG. 9 is similar to that shown in FIG. 8 except that more than one bump of the semiconductor package is used to carry higher currents from the same circuit node to the flying capacitors. As shown in FIG. 9, at least two bumps of the semiconductor package 100 are connected together through a redistribution line formed on the second side of the electrical routing apparatus 200.

As shown in FIG. 9, a first via 211 is connected to both bumps 212 and 216 through a first redistribution line 131. A second via 213 is connected to both bumps 214 and 218 through a second redistribution line 133. By using the redistribution lines 131 and 133, the switched capacitor converter package can maintain the symmetrical arrangement of the flying capacitors. In particular, as shown in FIG. 9, one terminal of CF11 and one terminal of CF12 are arranged in a symmetrical manner with respect to the first via 211. One terminal of CF21 and one terminal of CF22 are arranged in a symmetrical manner with respect to the second via 213. The arrangement of connecting the multiple bumps carrying the same current first before bringing it to the flying capacitors through the via can minimize the differences in distance, resistance and/or inductance among all paths between the bumps and the flying capacitors, which minimizes the currently differences between flying capacitors, while allowing more current to be delivered from the semiconductor package.

Figure 10:
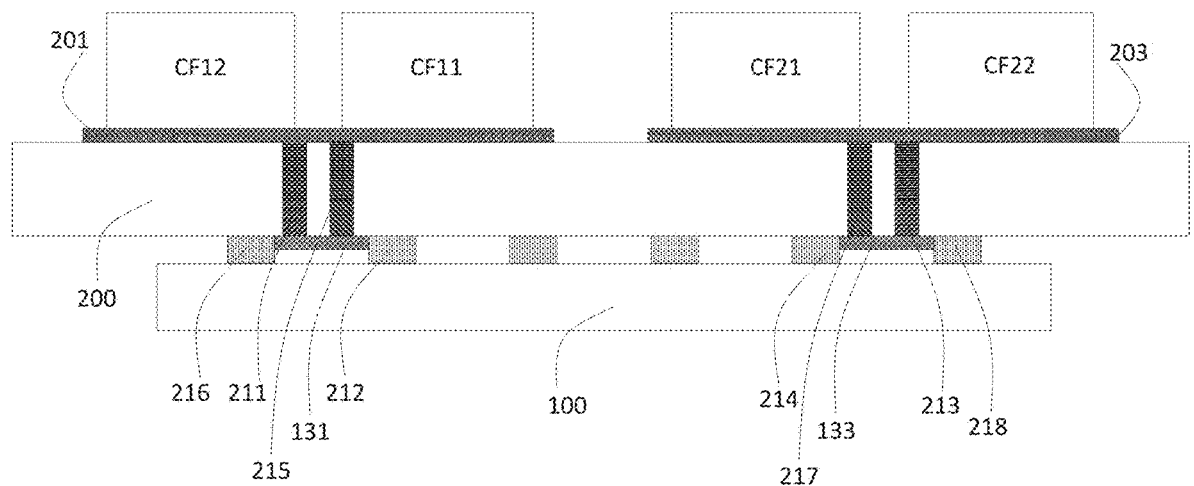
FIG. 10 illustrates a cross sectional view of a fourth implementation of the via connection of the switched capacitor converter package in accordance with various embodiments of the present disclosure.

FIG. 10 illustrates a cross sectional view of a fourth implementation of the via connection of the switched capacitor converter package in accordance with various embodiments of the present disclosure. The fourth implementation of the switched capacitor converter package shown in FIG. 10 is similar to that shown in FIG. 9 except that more than one via may be used to carry higher currents from the second side of the electrical routing apparatus 200 to the flying capacitors. As shown in FIG. 10, the two flying capacitors (e.g., CF11 and CF12) are placed in a substantially symmetric manner with respect to a center of the two vias (e.g., vias 211 and 215).

As shown in FIG. 10, a first group of vias 211 and 215 are connected to both the bumps 212 and 216 through a first redistribution line 131, and the vias 211 and 215 are connected to the flying capacitors CF12 and CF11 through the PCB trace 201. A second group of vias 213 and 217 are connected to both the bumps 214 and 218 through a second redistribution line 133, and the vias 213 and 217 are connected to the flying capacitor CF21 and CF22 through the PCB trace 203. By using two vias (e.g., vias 211 and 215), more current can be carried from the redistribution lines to the PCB traces connecting the terminals of the flying capacitors. Throughout the description, the first group of vias may be alternatively referred to as a first conductive channel. The second group of vias may be alternatively referred to as a second conductive channel. As shown in FIG. 10, the first conductive channel is electrically coupled between the semiconductor package 100 and two adjacent flying capacitors CF11 and CF12. The first conductive channel is electrically coupled between the semiconductor package 100 and two adjacent flying capacitors CF21 and CF22.

The switched capacitor converter package shown in FIG. 10 can maintain the symmetrical arrangement of the flying capacitors too. In particular, as shown in FIG. 10, one terminal of CF11 and one terminal of CF12 are arranged in a symmetrical manner with respect to a center of the first via group comprising via 211 and via 215. One terminal of CF21 and one terminal of CF22 are arranged in a symmetrical manner with respect to a center of the second via group comprising via 213 and via 217. The arrangement of placing the flying capacitors in a symmetrical manner with respect to a center of a via group further minimizes the differences in distance, resistance and/or inductance among all paths between the bumps and the flying capacitors. This arrangement minimizes the current distribution difference between the flying capacitors, thereby allowing more current to be delivered to the flying capacitors.

It should be noted that depending on different applications and design needs, a plural of bumps and/or a plural of vias can be used to connect the semiconductor package and the flying capacitors. However, in order to minimize the difference in resistance, inductance, and/or length of each current path, the multiple bumps are first connected with redistribution lines and then connected to the flying capacitors through a group of vias. The flying capacitors are placed in a substantially symmetric manner with respect to the center of the group of vias. Such an arrangement helps to achieve a uniform current distribution between different current paths, thereby minimizing power losses during charge transferring, and yielding higher power conversion efficiency.

Figure 11:
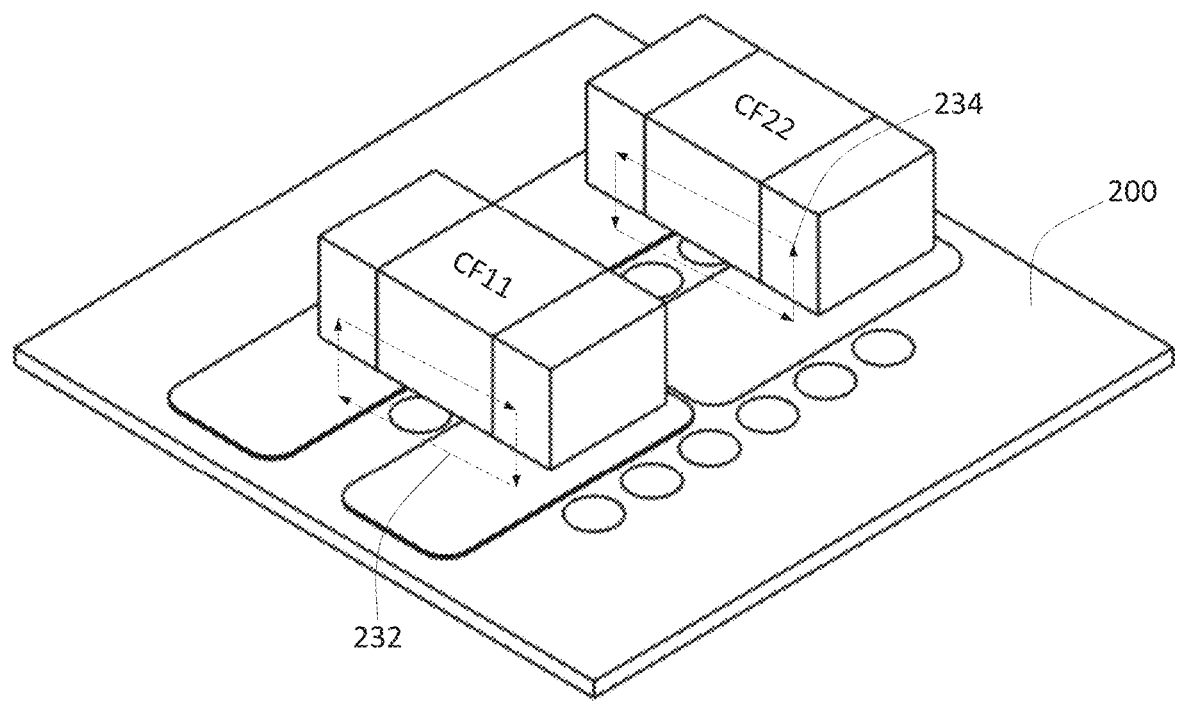
FIG. 11 illustrates another perspective view of the top side of the switched capacitor converter package in accordance with various embodiments of the present disclosure.

FIG. 11 illustrates another perspective view of the top side of the switched capacitor converter package in accordance with various embodiments of the present disclosure. For better illustrating the direction of the currents flowing through the flying capacitors, the second capacitor CF12 and the third capacitor CF21 are intentionally hidden from view.

In operation, a first phase current flows through the first capacitor CF11 and the second capacitor CF12. A second phase current flows through the third capacitor CF21 and the fourth capacitor CF22. The direction of the first phase current is indicated by the dashed line 232. The direction of the second phase current is indicated by the dashed line 234. After the first capacitor, the second capacitor, the third capacitor and the fourth capacitor are placed on the PCB 200, the first phase current and the second phase current flow in opposite directions to each other as shown in FIG. 11.

As shown in FIG. 11, the current plane defined by the dashed line 232 and the current plane defined by the dashed line 234 are parallel, and the directions of the currents in these two current planes are opposite. The opposite directions of the currents help to make the far-field magnetic fields cancel each other out, thereby reducing the electromagnetic radiation. Referring back to FIG. 2, the current of the first phase and the current of the second phase flow in the same direction. The far-field magnetic fields produced by these two currents are added together. As such, the switched capacitor converter package shown in FIG. 11 has a great advantage in reducing EMI.

Figure 2:
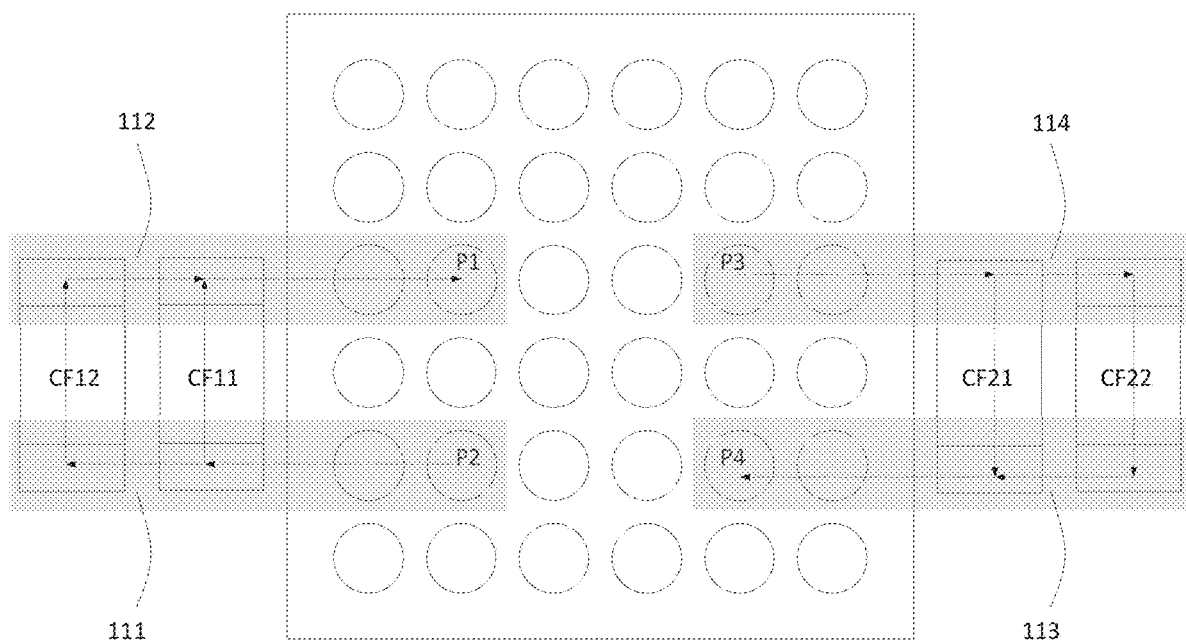
FIG. 2 illustrates a layout of a dual-phase switched capacitor converter having multiple flying capacitors.

In a conventional system shown in FIG. 2, the current plane is parallel to the PCB. In the system shown in FIG. 11, the current plane is perpendicular to the PCB. At the same time, the area enclosed by the current plane shown in FIG. 11 is mainly determined by the thickness of the PCB, which is much smaller than the area enclosed by the current plane in FIG. 2. As a result of having a smaller area enclosed by the current plane shown in FIG. 11, the amplitude of the EMI spurious emission can be reduced accordingly.

Figure 12:
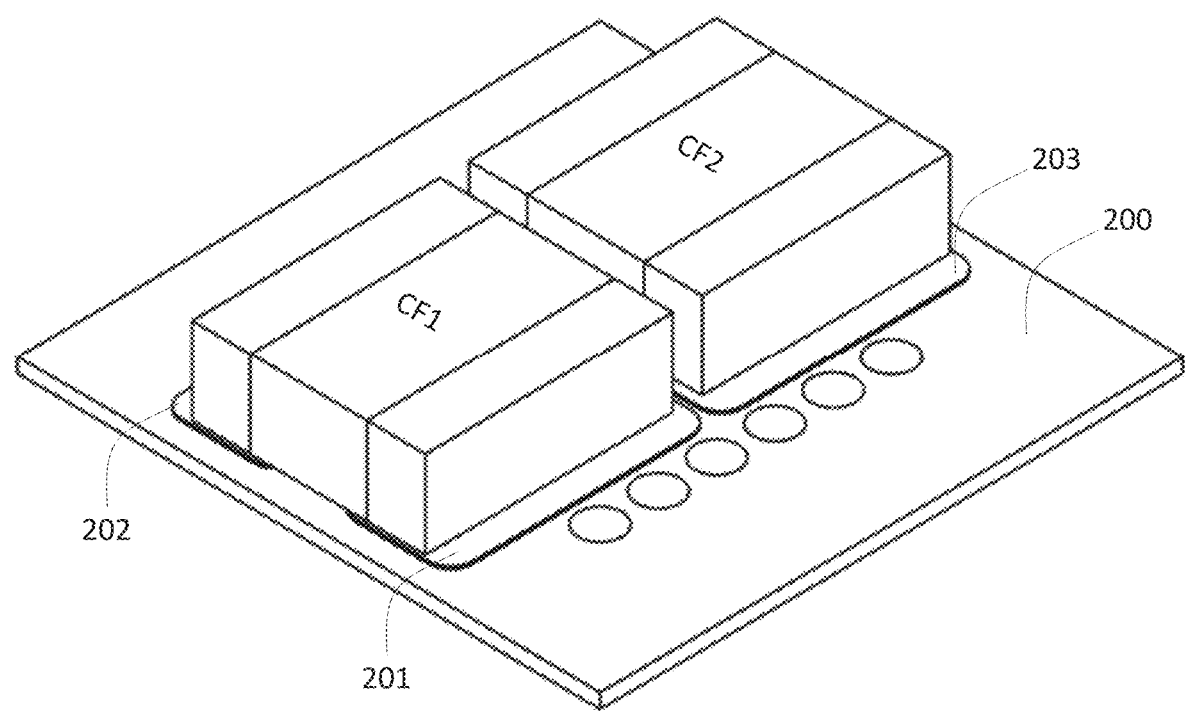
FIG. 12 illustrates a perspective view of a top side of another switched capacitor converter package in accordance with various embodiments of the present disclosure.

FIG. 12 illustrates a perspective view of a top side of another switched capacitor converter package in accordance with various embodiments of the present disclosure. The switched capacitor converter package shown in FIG. 12 is similar to that shown in FIG. 4 except that the first capacitor CF11 and the second capacitor CF12 are replaced by a first reverse geometry capacitor CF1, and the third capacitor CF21 and the fourth capacitor CF22 are replaced by a second reverse geometry capacitor CF2.

In some embodiments, the reverse geometry capacitor (e.g., CH) is obtained through rotating the orientation of a normal capacitor by 90 degrees. After rotating the orientation, the current path through the capacitor is shorten and effectively lowers the parasitic inductance value.

In operation, in order to have a sufficiently uniform current distribution in the flying capacitors CF1 and CF2, the bump of the semiconductor package connected to the corresponding flying capacitor need to be located close to the center of the capacitor terminal to achieve the smallest equivalent series connection resistance.

Figure 13:
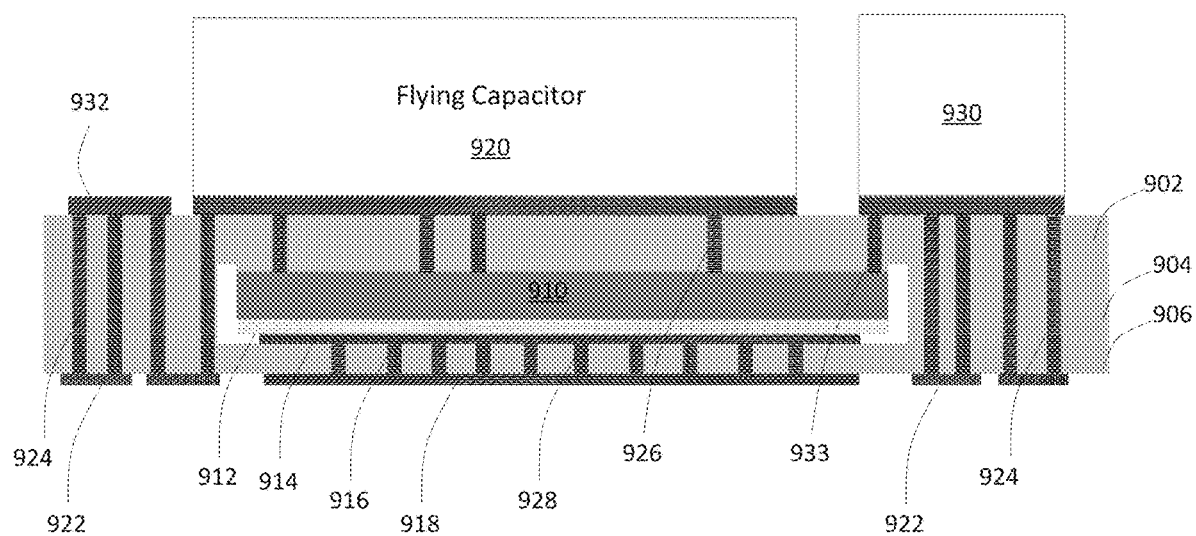
FIG. 13 illustrates a cross sectional view of another implementation of the switched capacitor converter package in accordance with various embodiments of the present disclosure.

FIG. 13 illustrates a cross sectional view of another implementation of the switched capacitor converter package in accordance with various embodiments of the present disclosure. For better illustrating the primary aspect of this embodiment, only one flying capacitor is included in this cross sectional view.

As shown in FIG. 13, a flying capacitor 920 and a passive component 930 are mounted on a PCB. The passive component 930 may be an input capacitor. The flying capacitor 920 and the passive component 930 are connected to the vias of the PCB through a plurality of PCB traces 932.

The PCB comprises a first layer 902, a second layer 904 and a third layer 906 stacked on top of each other. The PCB further comprises a plurality of vias 924 extending through the three layers, a plurality of input/output pads 922, a plurality of vias 928 extending through the third layer 906, a plurality of vias 926 extending through the first layer 902, and a via 933 extending through the first layer 902.

A semiconductor die 910 is placed between the first layer 902 and the third layer 906. In some embodiments, the layers of the PCB wrap the semiconductor die 910. The semiconductor die 910 comprises the switches of a dual-phase switched capacitor converter and a controller for generating the gate drive signals of the switches. A thermal epoxy layer 912 is placed between the semiconductor die 910 and a thermal pad 918 of the PCB. The thermal epoxy is a material with high thermal conductivity. In this way, the large exposed metal area at the bottom of the package can have a better heat dissipation effect than the existing planar capacitor solution shown in FIG. 2.

One advantageous feature of the switched capacitor converter package shown in FIGS. 4-13 is that the semiconductor package, the PCB and the flying capacitors form a three-dimensional device. Such a three-dimensional device helps to reduce the board area occupied by a dual-phase switched capacitor converter. At the same time, on the basis of the three-dimensional device, the connecting points of the flying capacitors and the semiconductor device are located in the middle of two flying capacitors. Such a connection configuration helps to distribute the current evenly between two adjacent flying capacitors, and maintain balanced ESR and ESL in different conductive paths, thereby reducing the power loss and improving power conversion efficiency. The three-dimensional device also helps to reduce EMI emissions and improve heat dissipation.

Figure 14:
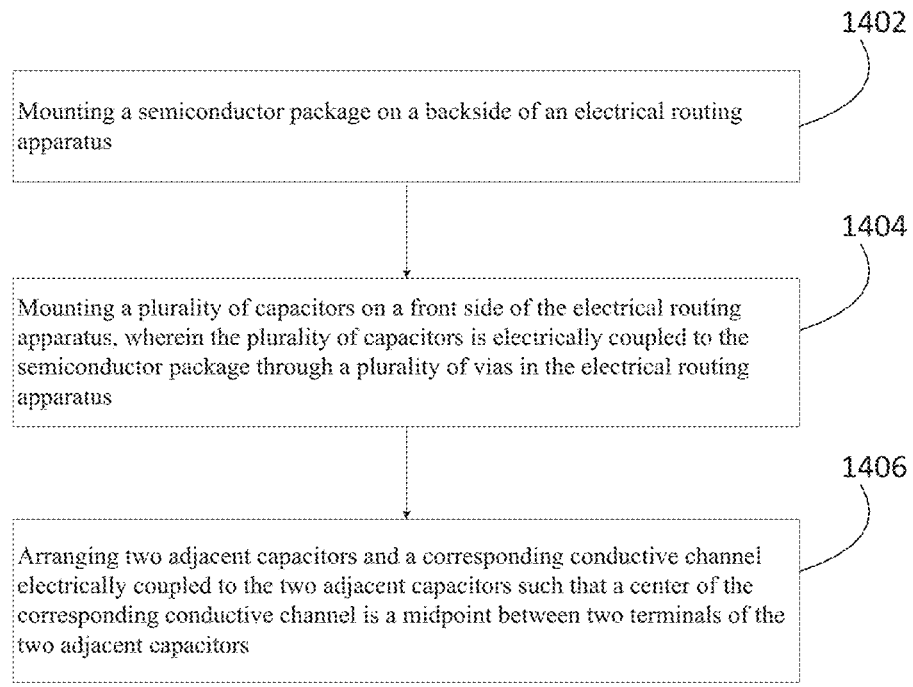
FIG. 14 illustrates a flow chart of a method for forming the switched capacitor converter package shown in FIGS. 4-5 in accordance with various embodiments of the present disclosure.

FIG. 14 illustrates a flow chart of a method for forming the switched capacitor converter package shown in FIGS. 4-5 in accordance with various embodiments of the present disclosure. This flowchart shown in FIG. 14 is merely an example, which should not unduly limit the scope of the claims. One of ordinary skill in the art would recognize many variations, alternatives, and modifications. For example, various steps illustrated in FIG. 14 may be added, removed, replaced, rearranged and repeated.

Referring back to FIGS. 4-5, a switched capacitor converter package comprises a semiconductor package (e.g., semiconductor package 100), a first capacitor (e.g., CF11), a second capacitor (e.g., CF12), a third capacitor (e.g., CF21) and a fourth capacitor (e.g., CF22). The semiconductor package is on a first side of an electrical routing apparatus (e.g., electrical routing apparatus 200). The first capacitor and a second capacitor on a second side of the electrical routing apparatus. The first capacitor and the second capacitor are adjacent to each other and connected in parallel. The third capacitor and the fourth capacitor are on the second side of the electrical routing apparatus. The third capacitor and the fourth capacitor are adjacent to each other and connected in parallel. In some embodiments, the electrical routing apparatus is a PCB having a plurality of vias. The first side and the second side are two opposite sides of the PCB.

The semiconductor package comprises switches of a dual-phase switched capacitor converter. Referring back to FIG. 6, the first capacitor CF11 is electrically connected to two switching nodes of a first phase of the dual-phase switched capacitor converter through a first via V1 and a second via V2, respectively. The second capacitor CF12 is electrically connected to two switching nodes of the first phase of the dual-phase switched capacitor converter through the first via V1 and the second via V2, respectively. The first capacitor and the second capacitor are connected in parallel. Furthermore, the first capacitor and the second capacitor are arranged in a symmetrical manner with respect to the first via V1 and the second via V2.

Referring back to FIG. 6, the third capacitor CF21 is electrically connected to two switching nodes of a second phase of the dual-phase switched capacitor converter through a third via V3 and a fourth via V4, respectively. The fourth capacitor CF22 is electrically connected to two switching nodes of the second phase of the dual-phase switched capacitor converter through the third via V3 and the fourth via V4, respectively. The third capacitor and the fourth capacitor are connected in parallel. Furthermore, the third capacitor and the fourth capacitor are arranged in a symmetrical manner with respect to the third via V3 and the fourth via V4.

Referring back to FIG. 3, the semiconductor package comprises switches of a dual-phase switched capacitor converter and a controller configured to generated gate drive signals for the switches of the dual-phase switched capacitor converter. The dual-phase switched capacitor converter comprises a first switch, a second switch, a third switch and a fourth switch connected in series between an input voltage bus and ground, a first capacitor and a second capacitor connected in parallel, and wherein a first terminal of the first capacitor and a first terminal of the second capacitor are connected together and further connected to a common node of the first switch and the second switch, and a second terminal of the first capacitor and a second terminal of the second capacitor are connected together and further connected to a common node of the third switch and the fourth switch.

The dual-phase switched capacitor converter further comprises a fifth switch, a sixth switch, a seventh switch and an eighth switch connected in series between the input voltage bus and ground, a third capacitor and a fourth capacitor connected in parallel, and wherein a first terminal of the third capacitor and a first terminal of the fourth capacitor are connected together and further connected to a common node of the fifth switch and the sixth switch, and a second terminal of the third capacitor and a second terminal of the fourth capacitor are connected together and further connected to a common node of the seventh switch and the eighth switch.

At step 1402, a semiconductor package (e.g., semiconductor package 100 shown in FIG. 5) is mounted on a backside of an electrical routing apparatus. The semiconductor package comprises the switches of the dual-phase switched capacitor converter and a controller. The electrical routing apparatus is a PCB.

At step 1404, a plurality of capacitors (e.g., flying capacitors CF11, CF12, CF21 and CF22 shown in FIG. 4) is mounted on a front side of the electrical routing apparatus. The plurality of capacitors is electrically coupled to the semiconductor package through a plurality of vias in the electrical routing apparatus.

Referring back to FIG. 3, the plurality of capacitors comprises CF11, CF12, CF21 and CF22. CF11 and CF12 are the flying capacitors of the first phase of the dual-phase switched capacitor converter. CF21 and CF22 are the flying capacitors of the second phase of the dual-phase switched capacitor converter.

At step 1406, two adjacent capacitors (e.g., CF11 and CF12) and a corresponding conductive channel electrically coupled to the two adjacent capacitors are arranged such that a center of the corresponding conductive channel is a midpoint between two terminals of the two adjacent capacitors.

The method further comprises connecting a first terminal of the first capacitor and a first terminal of the second capacitor to the semiconductor package through a first group of vias of the plurality of vias, wherein the first capacitor and the second capacitor are the two adjacent capacitors, vias of the first group of vias form a first conductive channel between the semiconductor package and two terminals of the first capacitor and the second capacitor, and the first terminal of the first capacitor and the first terminal of the second capacitor are arranged in a symmetrical manner with respect to a center of the first group of vias of the plurality of vias.

The method further comprises connecting a second terminal of the first capacitor and a second terminal of the second capacitor to the semiconductor package through a second group of vias of the plurality of vias, wherein vias of the second group of vias form a second conductive channel between the semiconductor package and two terminals of the first capacitor and the second capacitor, and the second terminal of the first capacitor and the second terminal of the second capacitor are arranged in a symmetrical manner with respect to a center of the second group of vias of the plurality of vias.

The method further comprises connecting a first terminal of the third capacitor and a first terminal of the fourth capacitor to the semiconductor package through a third group of vias of the plurality of vias, and wherein the third capacitor and the fourth capacitor are the two adjacent capacitors, vias of the third group of vias form a third conductive channel between the semiconductor package and two terminals of the third capacitor and the fourth capacitor, and the first terminal of the third capacitor and the first terminal of the fourth capacitor are arranged in a symmetrical manner with respect to a center of the third group of vias of the plurality of vias.

The method further comprises connecting a second terminal of the third capacitor and a second terminal of the fourth capacitor to the semiconductor package through a fourth group of vias of the plurality of vias, and wherein vias of the fourth group of vias form a fourth conductive channel between the semiconductor package and two terminals of the third capacitor and the fourth capacitor, and the second terminal of the third capacitor and the second terminal of the fourth capacitor are arranged in a symmetrical manner with respect to a center of the fourth group of vias of the plurality of vias.

The method further comprises connecting a first terminal of the first capacitor and a first terminal of the second capacitor to the semiconductor package through a first via of the plurality of vias, connecting a second terminal of the first capacitor and a second terminal of the second capacitor to the semiconductor package through a second via of the plurality of vias, connecting a first terminal of the third capacitor and a first terminal of the fourth capacitor to the semiconductor package through a third via of the plurality of vias, and connecting a second terminal of the third capacitor and a second terminal of the fourth capacitor to the semiconductor package through a fourth via of the plurality of vias.

The method further comprises connecting the semiconductor package with the electrical routing apparatus through a plurality of bumps. At least one bump is in direct contact with the first via of the plurality of vias.

The method further comprises connecting the semiconductor package with the electrical routing apparatus through a plurality of bumps. At least one bump is connected to the first via of the plurality of vias through a redistribution line.

The method further comprises embedding a semiconductor die comprising switches of the dual-phase switched capacitor converter in the electrical routing apparatus, forming a thermal epoxy layer over the semiconductor die, and forming a thermal pad over the thermal epoxy layer.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A switched capacitor converter package comprising:
  a semiconductor package on a first side of an electrical routing apparatus;
  a first capacitor and a second capacitor on a second side of the electrical routing apparatus, wherein the first capacitor and the second capacitor are adjacent to each other and connected in parallel; and
  a third capacitor and a fourth capacitor connected on the second side of the electrical routing apparatus, wherein the third capacitor and the fourth capacitor are adjacent to each other and connected in parallel, wherein the first capacitor, the second capacitor, the third capacitor and the fourth capacitor are connected to the semiconductor package through a plurality of vias extending from the first side of the electrical routing apparatus to the second side of the electrical routing apparatus.

2. The switched capacitor converter package of claim 1, wherein:
  the electrical routing apparatus is a printed circuit board (PCB) having the plurality of vias, and wherein:
    a first terminal of the first capacitor and a first terminal of the second capacitor are connected together through a first PCB trace and electrically coupled to the semiconductor package through a first group of vias of the plurality of vias;
    a second terminal of the first capacitor and a second terminal of the second capacitor are connected together through a second PCB trace and electrically coupled to the semiconductor package through a second group of vias of the plurality of vias;
    a first terminal of the third capacitor and a first terminal of the fourth capacitor are connected together through a third PCB trace and electrically coupled to the semiconductor package through a third group of vias of the plurality of vias; and
    a second terminal of the third capacitor and a second terminal of the fourth capacitor are connected together through a fourth PCB trace and electrically coupled to the semiconductor package through a fourth group of vias of the plurality of vias.

3. The switched capacitor converter package of claim 2, wherein:
  the first terminal of the first capacitor and the first terminal of the second capacitor are arranged in a symmetrical manner with respect to a center of the first group of vias of the plurality of vias;
  the second terminal of the first capacitor and the second terminal of the second capacitor are arranged in a symmetrical manner with respect to a center of the second group of vias of the plurality of vias;

the first terminal of the third capacitor and the first terminal of the fourth capacitor are arranged in a symmetrical manner with respect to a center of the third group of vias of the plurality of vias; and the second terminal of the third capacitor and the second terminal of the fourth capacitor are arranged in a symmetrical manner with respect to a center of the fourth group of vias of the plurality of vias.

4. The switched capacitor converter package of claim 2, wherein:

the first terminal of the first capacitor and the first terminal of the second capacitor are connected together through the first PCB trace and electrically coupled to a first group of bumps of the semiconductor package through the first group of vias, and wherein bumps of the first group of bumps are connected to each other through a first redistribution line formed on the second side of the electrical routing apparatus;

the second terminal of the first capacitor and the second terminal of the second capacitor are connected together through the second PCB trace and electrically coupled to a second group of bumps of the semiconductor package through the second group of vias, and wherein bumps of the second group of bumps are connected to each other through a second redistribution line formed on the second side of the electrical routing apparatus;

the first terminal of the third capacitor and the first terminal of the fourth capacitor are connected together through the third PCB trace and electrically coupled to a third group of bumps of the semiconductor package through the third group of vias, and wherein bumps of the third group of bumps are connected to each other through a third redistribution line formed on the second side of the electrical routing apparatus; and the second terminal of the third capacitor and the second terminal of the fourth capacitor are connected together through the fourth PCB trace and electrically coupled to a fourth group of bumps of the semiconductor package through the fourth group of vias, and wherein bumps of the fourth group of bumps are connected to each other through a fourth redistribution line formed on the second side of the electrical routing apparatus.

5. The switched capacitor converter package of claim 1, wherein:

the electrical routing apparatus is a printed circuit board (PCB) having a plurality of vias, and wherein:

a first terminal of the first capacitor and a first terminal of the second capacitor are connected together through a first PCB trace and electrically coupled to the semiconductor package through a first via of the plurality of vias;

a second terminal of the first capacitor and a second terminal of the second capacitor are connected together through a second PCB trace and electrically coupled to the semiconductor package through a second via of the plurality of vias;

a first terminal of the third capacitor and a first terminal of the fourth capacitor are connected together through a third PCB trace and electrically coupled to the semiconductor package through a third via of the plurality of vias; and a second terminal of the third capacitor and a second terminal of the fourth capacitor are connected together through a fourth PCB trace and electrically coupled to the semiconductor package through a fourth via of the plurality of vias.

6. The switched capacitor converter package of claim 5, wherein:

the first terminal of the first capacitor and the first terminal of the second capacitor are arranged in a symmetrical manner with respect to the first via of the plurality of vias;

the second terminal of the first capacitor and the second terminal of the second capacitor are arranged in a symmetrical manner with respect to the second via of the plurality of vias;

the first terminal of the third capacitor and the first terminal of the fourth capacitor are arranged in a symmetrical manner with respect to the third via of the plurality of vias; and the second terminal of the third capacitor and the second terminal of the fourth capacitor are arranged in a symmetrical manner with respect to the fourth via of the plurality of vias.

7. The switched capacitor converter package of claim 5, wherein:

at least one of the first via, the second via, the third via and the fourth via is connected to a corresponding bump of the semiconductor package through a redistribution line formed on the second side of the electrical routing apparatus.

8. The switched capacitor converter package of claim 1, wherein the semiconductor package comprises switches of a dual-phase switched capacitor converter and a controller configured to generate gate drive signals for the switches of the dual-phase switched capacitor converter, and wherein the dual-phase switched capacitor converter comprises:

a first switch, a second switch, a third switch and a fourth switch connected in series between an input voltage bus and ground;

the first capacitor and the second capacitor connected in parallel, and wherein a first terminal of the first capacitor and a first terminal of the second capacitor are connected together and further connected to a common node of the first switch and the second switch, and a second terminal of the first capacitor and a second terminal of the second capacitor are connected together and further connected to a common node of the third switch and the fourth switch;

a fifth switch, a sixth switch, a seventh switch and an eighth switch connected in series between the input voltage bus and ground; and the third capacitor and the fourth capacitor connected in parallel, and wherein a first terminal of the third capacitor and a first terminal of the fourth capacitor are connected together and further connected to a common node of the fifth switch and the sixth switch, and a second terminal of the third capacitor and a second terminal of the fourth capacitor are connected together and further connected to a common node of the seventh switch and the eighth switch.

9. The switched capacitor converter package of claim 1, wherein:

a first phase current flows through the first capacitor and the second capacitor; and a second phase current flows through the third capacitor and the fourth capacitor, and wherein the first capacitor, the second capacitor, the third capacitor and the fourth capacitor are arranged such that the first phase current and the second phase current flow in opposite directions to each other.

10. The switched capacitor converter package of claim 1, wherein the electrical routing apparatus is a printed circuit board (PCB), and wherein:
- at least a portion of the semiconductor package is embedded in the PCB; and
- a thermal epoxy layer placed between the semiconductor package and a thermal pad of the PCB.

11. A method comprising:
- mounting a semiconductor package on a backside of an electrical routing apparatus;
- mounting a plurality of capacitors on a front side of the electrical routing apparatus, wherein the plurality of capacitors is electrically coupled to the semiconductor package through a plurality of vias extending from the backside to the front side of the electrical routing apparatus; and
- arranging two adjacent capacitors and a corresponding conductive channel electrically coupled to the two adjacent capacitors such that a center of the corresponding conductive channel is a midpoint between two terminals of the two adjacent capacitors.

12. The method of claim 11, wherein:
the semiconductor package comprises switches of a dual-phase switched capacitor converter and a controller configured to generate gate drive signals for the switches of the dual-phase switched capacitor converter, and wherein the dual-phase switched capacitor converter comprises:
- a first switch, a second switch, a third switch and a fourth switch connected in series between an input voltage bus and ground;
- a first capacitor and a second capacitor connected in parallel, and wherein a first terminal of the first capacitor and a first terminal of the second capacitor are connected together and further connected to a common node of the first switch and the second switch, and a second terminal of the first capacitor and a second terminal of the second capacitor are connected together and further connected to a common node of the third switch and the fourth switch;
- a fifth switch, a sixth switch, a seventh switch and an eighth switch connected in series between the input voltage bus and ground; and
- a third capacitor and a fourth capacitor connected in parallel, and wherein a first terminal of the third capacitor and a first terminal of the fourth capacitor are connected together and further connected to a common node of the fifth switch and the sixth switch, and a second terminal of the third capacitor and a second terminal of the fourth capacitor are connected together and further connected to a common node of the seventh switch and the eighth switch.

13. The method of claim 12, further comprising:
connecting a first terminal of the first capacitor and a first terminal of the second capacitor to the semiconductor package through a first group of vias of the plurality of vias, wherein:
- the first capacitor and the second capacitor are the two adjacent capacitors;
- vias of the first group of vias form a first conductive channel between the semiconductor package and two terminals of the first capacitor and the second capacitor; and
- the first terminal of the first capacitor and the first terminal of the second capacitor are arranged in a symmetrical manner with respect to a center of the first group of vias of the plurality of vias;

connecting a second terminal of the first capacitor and a second terminal of the second capacitor to the semiconductor package through a second group of vias of the plurality of vias, wherein:
- vias of the second group of vias form a second conductive channel between the semiconductor package and two terminals of the first capacitor and the second capacitor; and
- the second terminal of the first capacitor and the second terminal of the second capacitor are arranged in a symmetrical manner with respect to a center of the second group of vias of the plurality of vias;

connecting a first terminal of the third capacitor and a first terminal of the fourth capacitor to the semiconductor package through a third group of vias of the plurality of vias, and wherein:
- the third capacitor and the fourth capacitor are the two adjacent capacitors;
- vias of the third group of vias form a third conductive channel between the semiconductor package and two terminals of the third capacitor and the fourth capacitor; and
- the first terminal of the third capacitor and the first terminal of the fourth capacitor are arranged in a symmetrical manner with respect to a center of the third group of vias of the plurality of vias; and connecting a second terminal of the third capacitor and a second terminal of the fourth capacitor to the semiconductor package through a fourth group of vias of the plurality of vias, and wherein:
- vias of the fourth group of vias form a fourth conductive channel between the semiconductor package and two terminals of the third capacitor and the fourth capacitor; and
- the second terminal of the third capacitor and the second terminal of the fourth capacitor are arranged in a symmetrical manner with respect to a center of the fourth group of vias of the plurality of vias.

14. The method of claim 12, further comprising:
- connecting a first terminal of the first capacitor and a first terminal of the second capacitor to the semiconductor package through a first via of the plurality of vias;
- connecting a second terminal of the first capacitor and a second terminal of the second capacitor to the semiconductor package through a second via of the plurality of vias;
- connecting a first terminal of the third capacitor and a first terminal of the fourth capacitor to the semiconductor package through a third via of the plurality of vias; and
- connecting a second terminal of the third capacitor and a second terminal of the fourth capacitor to the semiconductor package through a fourth via of the plurality of vias.

15. The method of claim 14, further comprising:
connecting the semiconductor package with the electrical routing apparatus through a plurality of bumps, wherein at least one bump is in direct contact with the first via of the plurality of vias.

16. The method of claim 14, further comprising:
connecting the semiconductor package with the electrical routing apparatus through a plurality of bumps, wherein at least one bump is connected to the first via of the plurality of vias through a redistribution line.

17. A system comprising:
a semiconductor package on a first side of a printed circuit board, wherein the semiconductor package comprises switches of a dual-phase switched capacitor converter;
a first capacitor on a second side of the printed circuit board, wherein the first capacitor is electrically connected to two switching nodes of a first phase of the dual-phase switched capacitor converter through a first via and a second via, respectively; and
a second capacitor on the second side of the printed circuit board, wherein the second capacitor is electrically connected to two switching nodes of a second phase of the dual-phase switched capacitor converter through a third via and a fourth via, respectively, and wherein the first via, the second via, the third via and the fourth via extend from the first side of the printed circuit board to the second side of the printed circuit board.

18. The system of claim 17, further comprising:
a third capacitor on the second side of the printed circuit board, wherein:
the first capacitor and the third capacitor are connected in parallel; and
the first capacitor and the second capacitor are arranged in a symmetrical manner with respect to the first via and the second via; and
a fourth capacitor on the second side of the printed circuit board, wherein:
the second capacitor and the fourth capacitor are connected in parallel; and
the second capacitor and the fourth capacitor are arranged in a symmetrical manner with respect to the third via and the fourth via.

19. The system of claim 17, wherein:
the first capacitor is a first reverse geometry capacitor; and
the second capacitor is a second reverse geometry capacitor.

20. The system of claim 17, wherein:
the printed circuit board comprises a first layer, a second layer and a third layer stacked on top of each other, and wherein a semiconductor die comprising switches of the dual-phase switched capacitor converter is placed between the first layer and the third layer.

* * * * *